United States Patent
Gu

(10) Patent No.: US 9,792,874 B2
(45) Date of Patent: Oct. 17, 2017

(54) ARRAY SUBSTRATE, METHOD FOR DRIVING THE SAME AND ELECTROCHROMIC DISPLAY

(71) Applicant: BOE TECHNOLOGY GROUP CO., LTD., Beijing (CN)

(72) Inventor: Xin Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 161 days.

(21) Appl. No.: 14/350,650

(22) PCT Filed: Jun. 18, 2013

(86) PCT No.: PCT/CN2013/077429
§ 371 (c)(1),
(2) Date: Apr. 9, 2014

(87) PCT Pub. No.: WO2014/172974
PCT Pub. Date: Oct. 30, 2014

(65) Prior Publication Data
US 2015/0348490 A1 Dec. 3, 2015

(30) Foreign Application Priority Data

Apr. 23, 2013 (CN) .......................... 2013 1 0143084

(51) Int. Cl.
*G09G 3/38* (2006.01)
*H01L 27/12* (2006.01)
(Continued)

(52) U.S. Cl.
CPC ............... *G09G 3/38* (2013.01); *G02F 1/155* (2013.01); *H01L 27/124* (2013.01);
(Continued)

(58) Field of Classification Search
CPC ............. G09G 3/38; G09G 2300/0443; G09G 2300/0426; G09G 2310/0254;
(Continued)

(56) References Cited

U.S. PATENT DOCUMENTS 4,758,069 A * 7/1988 Knothe .................... G09G 3/18
345/204
5,335,023 A * 8/1994 Edwards .................. G09G 3/20
345/100

(Continued)

FOREIGN PATENT DOCUMENTS

| CN | 1132384 A | 10/1996 |
|---|---|---|
| CN | 1105584 A | 1/2008 |
| CN | 102314032 A | 1/2012 |

OTHER PUBLICATIONS

First Chinese Office Action dated Jan. 26, 2015 Appln. No. 201310143084.X.
(Continued)

*Primary Examiner* — Seokyun Moon
*Assistant Examiner* — Joseph Fox
(74) *Attorney, Agent, or Firm* — Ladas & Parry LLP

(57) ABSTRACT

An array substrate, an electrochromic display and a method for driving the array substrate are disclosed. A display region of the array substrate (30) comprises a plurality of sets of data lines (33) and a plurality of scan lines (36), the plurality of sets of data lines (33) and the plurality of scan lines (36) intersecting each other to divide the display region into a plurality of pixel regions, a pixel electrode (32) is disposed in each of the pixel regions and electrically connected to the data lines (33); the pixel electrode (32) comprises a central pixel electrode (32a) and a peripheral pixel electrode (32b) adjacent to and electrically isolated from the central pixel electrode (32a). When the pixel region is driven, the peripheral pixel electrode (32b) and the central pixel electrode
(Continued)

(32a) are at opposite polarities, thereby making the electrochromic material flowing from the central pixel region (32a) corresponding to the central pixel electrode (32a) to the peripheral pixel electrode (32b) and having been changed in color to fade in color. Cross-talk between adjacent pixel regions in the electrochromic display panel can be effectively controlled, and the display effect of the electrochromic display can be improved.

19 Claims, 4 Drawing Sheets

(51) Int. Cl.
*G02F 1/155* (2006.01)
*G02F 1/163* (2006.01)
(52) U.S. Cl.
CPC ........... *G02F 2001/1635* (2013.01); *G09G 2300/0426* (2013.01); *G09G 2300/0443* (2013.01); *G09G 2310/027* (2013.01); *G09G 2310/0254* (2013.01); *G09G 2310/0262* (2013.01)

(58) Field of Classification Search
CPC ...... G09G 2310/027; G09G 2310/0262; H01L 27/124; G02F 1/155; G02F 2001/1635
See application file for complete search history.

(56) References Cited

U.S. PATENT DOCUMENTS

| | | | |
|---|---|---|---|
| 5,870,075 A | 2/1999 | Yamazaki et al. | |
| 8,253,874 B2 * | 8/2012 | Kim .................... | G02F 1/13439 257/59 |
| 2002/0154084 A1 * | 10/2002 | Tanaka .............. | G02F 1/134336 345/92 |
| 2006/0164352 A1 * | 7/2006 | Yoo ..................... | G02F 1/13624 345/87 |
| 2008/0238896 A1 * | 10/2008 | Kim .................... | G09G 3/3688 345/204 |
| 2008/0297676 A1 * | 12/2008 | Kimura .............. | G02F 1/13624 349/39 |
| 2013/0044094 A1 | 2/2013 | Li et al. | |

OTHER PUBLICATIONS

International Search Report mailed Feb. 13, 2014; PCT/CN2013/077429.

* cited by examiner

ARRAY SUBSTRATE, METHOD FOR DRIVING THE SAME AND ELECTROCHROMIC DISPLAY

TECHNICAL FIELD

The present invention relates to the display field, and more particularly, to an array substrate, a driving method for the array substrate, and an electrochromic display comprising the array substrate.

BACKGROUND

Electrochromism refers to the phenomenon in which the optical properties of a material (such as reflectivity, transmittivity, absorptivity and the like) can be stably and reversibly changed upon an external electric field being applied thereto and the material shows reversibly change in color and transparency. A material having the electrochromic property is referred to as an electrochromic material and a device made of the electrochromic material is referred to as an electrochromic device.

Electrochromic materials have recently been applied to display devices. In comparison with liquid crystal displays (LCDs), an electrochromic display has the advantages of having a memory function and being not restricted to viewing angles. FIG. 1 illustrates a cross-section view of a conventional electrochromic display panel. The electrochromic display panel comprises an upper substrate 10, a common electrode 20 disposed on the lower surface of the upper substrate 10, an array substrate 30, and an electrochromic material 80 filled between the upper substrate 10 and the array substrate 30. The array substrate 30 is divided into a display region and a frame region adjacent to the display region. The display region comprises a plurality of sets of data lines and a plurality of scan lines, and the plurality of sets of data lines and the plurality of scan lines intersect each other to divide the display region into a plurality of pixel regions. A pixel region comprises a pixel electrode 32 disposed on the upper surface of a lower substrate 31. An electric field is formed between the common electrode 20 and the pixel electrode 32 upon the electrodes being applied with a voltage therebetween to cause the electrochromic material to change color.

However, there exists an issue caused due to the following reasons: the electrochromic material is evenly distributed in each of the pixel regions while no gaps exist between the electrochromic materials in any two adjacent pixel regions; moreover, the electrochromic material is of liquidity. Therefore, when a pixel electrode corresponding to a pixel region is driven by a voltage while the pixel electrode in an adjacent pixel region is not driven by a voltage, the electrochromic material in the voltage-driven pixel region may easily flow to the pixel region not driven by the voltage, causing a color change in the pixel region not driven by the voltage, which will in turn give rise to cross-talk between adjacent pixel regions. As a result, the display effect of the electrochromic display panel is compromised.

Therefore, an urgent technical problem to be solved is how to avoid the cross-talk between adjacent pixel regions.

SUMMARY

To this end, an array substrate, a method for driving the same, and an electrochromic display comprising the array substrate are in need, and in the electrochromic panel it is difficult to generate cross-talk between adjacent pixel regions comprising the array substrate, and the electrochromic display comprising the array substrate has a better display effect.

A first aspect of the invention provides an array substrate, a display region of the array substrate comprises a plurality of sets of data lines and a plurality of scan lines, the plurality of sets of data lines and the plurality of scan lines intersecting each other to divide the display region into a plurality of pixel regions, a pixel electrode is disposed in each of the pixel regions and electrically connected to the data lines; the pixel electrode comprises a central pixel electrode and a peripheral pixel electrode adjacent to and electrically isolated from the central pixel electrode.

As an example, a central TFT and a peripheral TFT are disposed in the pixel region, each set of the data lines comprises a first data line and a second data line, a drain electrode of the central TFT is electrically connected to the central pixel electrode, a source electrode of the central TFT is electrically connected to the first data line, a drain electrode of the peripheral TFT is electrically connected to the peripheral pixel electrode, and a source electrode of the peripheral TFT is electrically connected to the second data line.

As an example, the central TFT and the peripheral TFT of each of the pixel regions are electrically connected to a same scan line.

Preferably, the peripheral pixel electrode comprises a plurality of pixel electrode bars, a notch is formed in one of the plurality of pixel electrode bars, the central pixel electrode is disposed in a space defined by the plurality of pixel electrode bars, and the drain electrode of the central TFT is electrically connected to the central pixel electrode by way of the notch.

As an example, a width of each of the pixel electrode bar is $\frac{1}{10}$ to $\frac{1}{5}$ of that of the central pixel electrode.

Another aspect of the invention provides an electrochromic display comprising the aforementioned array substrate provided by the invention.

As an example, the electrochromic display comprises a gate driver and a source driver, the gate driver is electrically connected to the plurality of scan lines, and the source driver is electrically connected to the plurality of sets of data lines.

As an example, the electrochromic display further comprises a voltage converter, a first terminal of the voltage converter is electrically connected to the source driver, a second terminal of the voltage converter is electrically connected to the central pixel electrode, and a third terminal of the voltage converter is electrically connected to the peripheral pixel electrode.

As an example, the electrochromic display further comprises a transmitter configured for transmitting a control signal; the voltage converter further comprises a fourth terminal electrically connected to the transmitter.

Still another aspect of the invention further provides a method for driving an array substrate, a display region of the array substrate comprises a plurality of sets of data lines and a plurality of scan lines, the plurality of sets of data lines and the plurality of scan lines intersecting each other to divide the display region into a plurality of pixel regions, a pixel electrode is disposed in each of the pixel regions and electrically connected to the data lines, wherein the pixel electrode comprises a central pixel electrode and a peripheral pixel electrode adjacent to and electrically isolated from the central pixel electrode, the driving method comprises supplying a first voltage to the central pixel electrode through the data lines, and supplying a second voltage to the peripheral pixel electrode through the data lines, and the first voltage and the second voltage are at opposite polarities.

As an example, an absolute value of the first voltage is no smaller than an absolute value of the second voltage.

As an example, the driving method comprises supplying the first voltage first and then supplying the second voltage.

As an example, the second voltage is lagged behind the first voltage by 0.05 s to 0.1 s.

As an example, a central TFT and a peripheral TFT are disposed in the pixel region, each set of the data lines comprises a first data line and a second data line, a drain electrode of the central TFT is electrically connected to the central pixel electrode, a source electrode of the central TFT is electrically connected to the first data line, a drain electrode of the peripheral TFT is electrically connected to the peripheral pixel electrode, a source electrode of the peripheral TFT is electrically connected to the second data line, the driving method comprises supplying the first voltage to the central pixel electrode via the first data line, supplying the second voltage to the peripheral pixel electrode via the second data line, and controlling ON and OFF states of the central TFT and the peripheral TFT via the scan line.

As an example, the driving method comprises controlling the ON and OFF states of the central TFT and the peripheral TFT via a same scan line in each of the pixel region.

When the electrochromic display provided by the invention is powered on, in the driven pixel region, the polarity of the peripheral pixel electrode is opposite to that of the central pixel electrode. Therefore an opposite voltage can be applied to the electrochromic material around the central pixel electrode through the peripheral pixel electrode, such that the electrochromic material that has been changed in color under the influence of the central pixel electrode and flows to the peripheral pixel region corresponding to the peripheral pixel electrode can be reversely changed in color under the action of the peripheral pixel electrode. As a result, the cross-talk between adjacent pixel regions in the electrochromic display panel can be effectively controlled and the display effect of the electrochromic display is improved.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

NUMERAL REFERENCE 10-upper substrate; 20-common electrode; 30-array substrate; 31-lower substrate; 32-pixel electrode; 33-data line; 34-peripheral TFT; 35-central TFT; 36-scan lien; 40-gate driver; 50-source driver; 60-voltage converter; 70-transmitter; 80-electrochromic material; 32a-central pixel electrode; 32b-peripheral pixel electrode; 33a-first data line; 33b-second data line; 321-pixel electrode bar; 322-notch.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprises," "comprising," "includes," "including" and the like are intended to specify that the elements or the objects stated before these terms encompass the elements or the objects and equivalents thereof listed after these terms, but do not preclude the other elements or objects. The phrases "connect", "connected" and the like are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the following, embodiments of the invention will be described in detail with reference to the drawings. It can be appreciated that the embodiments described herein are for illustrative and exemplifying purpose only and should not be construed as limitative to the invention.

Figure 1:
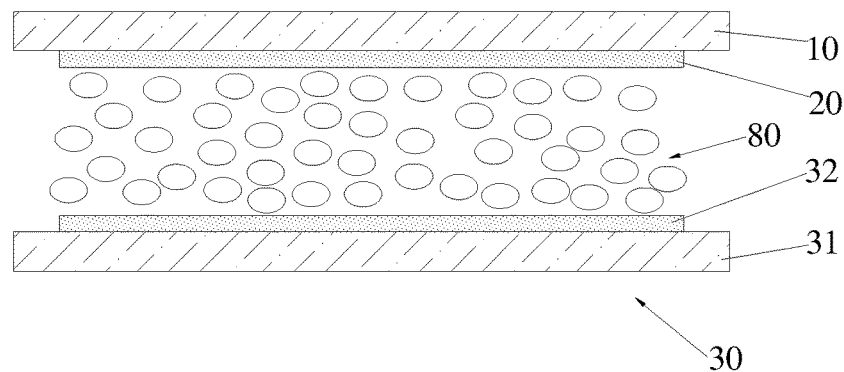
FIG. 1 schematically illustrates a cross-section of an electrochromic display panel.
Figure 2:
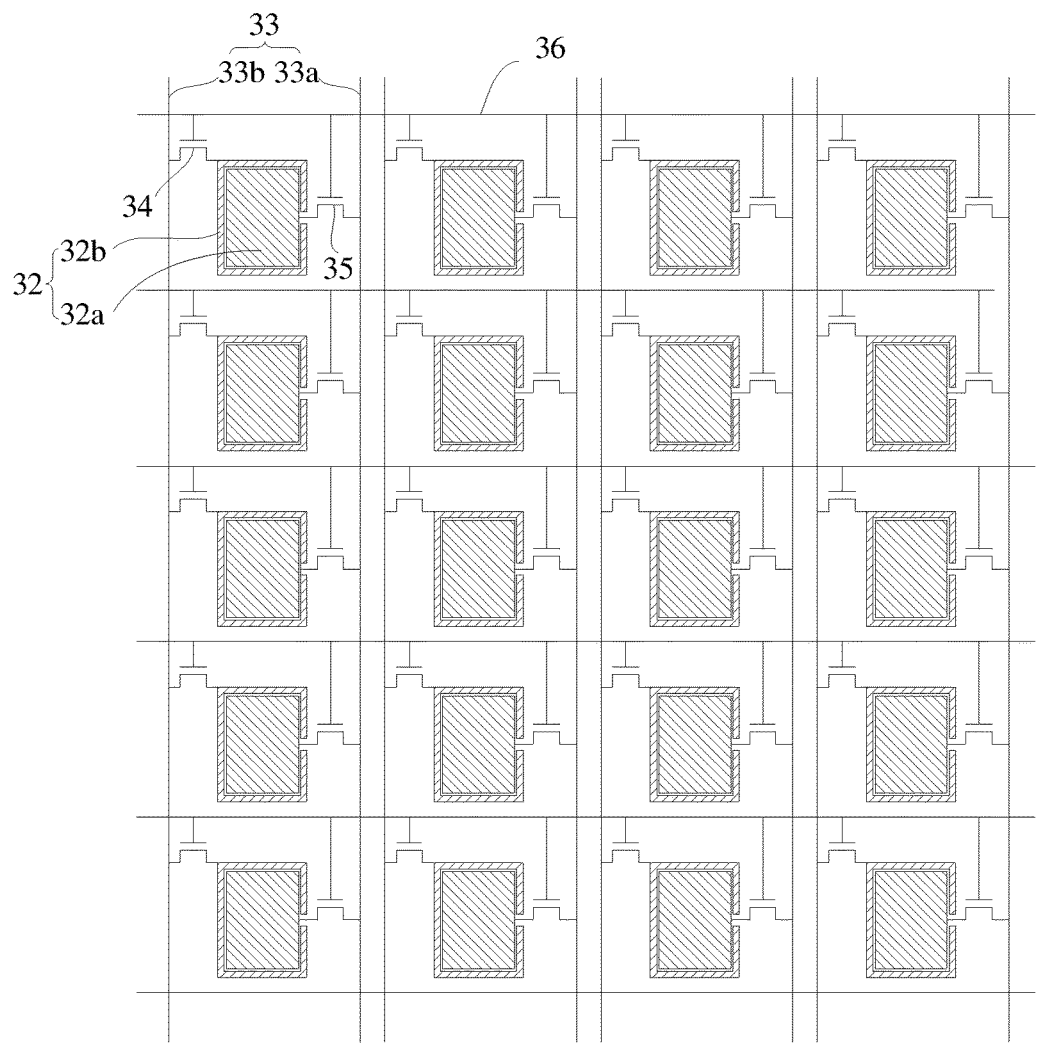
FIG. 2 schematically illustrates a configuration of an array substrate of the invention.

As illustrated in FIG. 2, an array substrate 30 is provided according to an aspect of the invention. The display region of the array substrate 30 comprises a plurality of sets of data lines 33 and a plurality of scan lines 36, the plurality of sets of data lines 33 and the plurality of scan lines 36 intersect each other to divide the display region into a plurality of pixel regions, and a pixel electrode 32 is disposed in each of the pixel regions and electrically connected to data lines 33; the pixel electrode 32 comprises a central pixel electrode 32a and a peripheral pixel electrode 32b adjacent to and electrically isolated from the central pixel electrode 32a.

It can be understood by a person of ordinary skill in the art the array substrate may further comprise a common electrode and a common electrode line electrically connected to the common electrode. Generally, a common electrode corresponding to the pixel electrode in each of the pixel regions is disposed in the pixel region. When the array substrate is applied with a voltage, an electric field is formed by the pixel electrode in cooperation with the corresponding common electrode and applied to the electrochromic material or liquid crystal molecules, and therefore the color of the electrochromic material or the orientation of the liquid crystal molecules is varied.

When the array substrate 30 provided the invention is applied to an electrochromic display panel of an electrochromic display and voltages are supplied to the array substrate 30 via a source driver of the electrochromic display, so that the central pixel electrode 32a and the peripheral pixel electrode 32b may be at opposite polarities.

In the embodiment of the invention, the portion in the pixel region that corresponds to the central pixel electrode 32a may be referred to as a central pixel region, and the portion corresponding to the peripheral pixel electrode 32b referred to as a peripheral pixel region. It should be appreciated that the central pixel region is the main display region and therefore the area of the central pixel region is larger than that of the peripheral pixel region.

When the pixel region is driven, the polarity of the central pixel electrode 32a is opposite to that of the peripheral pixel electrode 32b. The central pixel electrode 32a applies a voltage to the electrochromic material in the central pixel region and the peripheral pixel electrode 32b applies another voltage to the electrochromic material in the peripheral pixel region. Since the polarity of the central pixel electrode 32a is opposite to that of the peripheral pixel electrode 32b, the voltage applied by the central pixel electrode 32a is opposite to that applied by the peripheral pixel electrode 32b. In this case, the electrochromic material that flows from the central pixel region to the peripheral pixel region and has been changed in color will fade in color again under the action of the voltage applied by the peripheral pixel electrode 32b. It can thus effectively control the problem of incurring cross-talk between adjacent pixel regions in the electrochromic display panel and improve the display effect of the electrochromic display.

To ensure that the peripheral pixel electrode 32b and the central pixel electrode 32a are at opposite polarities when the array substrate 30 is powered on, two thin film transistors (TFTs) may be used to respectively control the peripheral pixel electrode 32b and the central pixel electrode 32a. As an example, a central TFT 35 and a peripheral TFT 34 may be disposed in each of the pixel regions. Accordingly, each set of data lines 33 may comprise a first data line 33a and a second data line 33b. The drain electrode of the central TFT 35 is electrically connected to the central pixel electrode 32a, the source electrode of the central TFT 35 is electrically connected to the first data line 33a, the drain electrode of the peripheral TFT 34 is electrically connected to the peripheral pixel electrode 32b, and the source electrode of the peripheral TFT 32b is electrically connected to the second data line 33b.

When the central TFT 35 is switched on, the first data line 33a supplies a voltage to the central pixel electrode 32a; when the peripheral TFT 34 is switched on, the second data line 33a supplies a voltage to the peripheral pixel electrode 32b.

In the embodiment of the invention, the central TFT 35 and the peripheral TFT 34 in each of the pixel regions may correspond to a same scan line. As an example, the central TFT 35 and the peripheral TFT 34 in each of the pixel regions are electrically connected to same one scan line 36, which helps to make the configuration of the array substrate 30 simpler and can facilitate the fabrication.

In the embodiment of the invention, as long as the peripheral pixel electrode 32b is disposed close to the central pixel electrode 32a and the electrochromic material in the peripheral pixel region can be made to fade in color, there will not be any special requirement on the specific location and configuration of the peripheral pixel electrode 32a.

In the embodiment of the invention, the peripheral pixel region may be located at any side of the central pixel region. As an example, the peripheral pixel region may be positioned on both sides of the central pixel region. When the electrochromic display panel comprising the array substrate 30 provided by the embodiment of the invention is driven, the peripheral pixel region located on both sides of the central pixel region may fade in color, thereby alleviating the cross-talk in the electrochromic display panel.

As an example, the peripheral pixel region may surround the central pixel region. As a result, when the electrochromic display panel comprising the array substrate 30 provided by the embodiment of the invention is driven, the peripheral pixel region surrounding the central pixel region may fade in color, thereby alleviating the cross-talk in the electrochromic display panel to a large extent.

Figure 3:
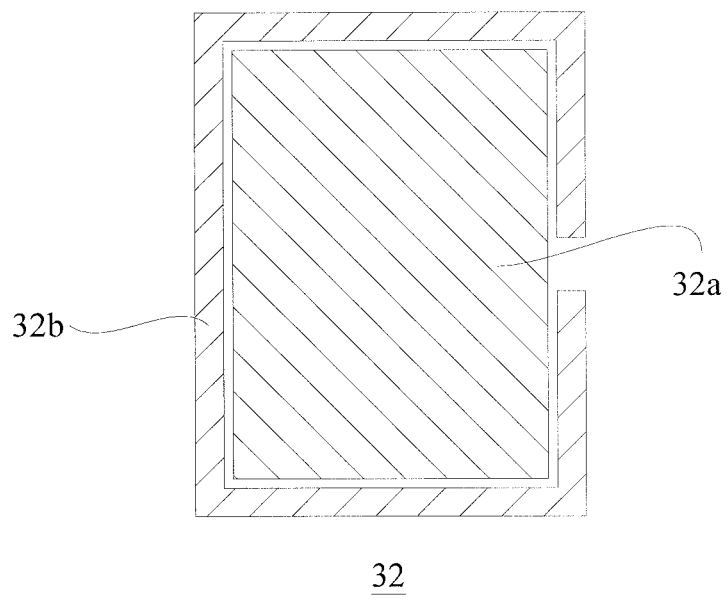
FIG. 3 schematically illustrates a configuration of a pixel electrode of the array substrate illustrated in FIG. 2.
Figure 4:
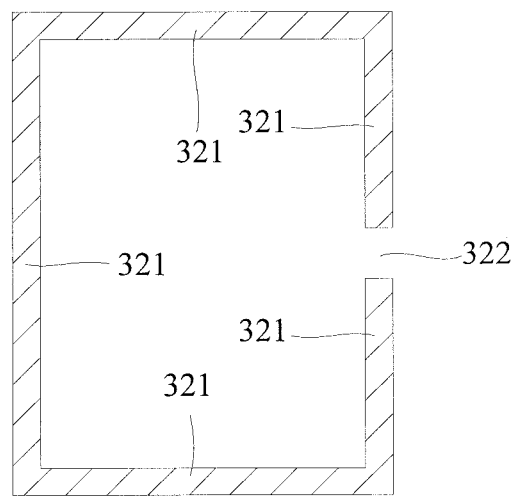
FIG. 4 schematically illustrates a configuration of a peripheral pixel electrode in the pixel electrode illustrated in FIG. 3.

To achieve the above objective, as illustrated in FIGS. 2 to 4, the central pixel electrode 32a may be embedded within the peripheral pixel electrode 32b. For example, as illustrated in FIGS. 3 and 4, the peripheral pixel electrode 32b may comprise a plurality of pixel electrode bars 321, a notch 322 is formed in one of the plurality of pixel electrode bars 321, the central pixel electrode 32a is disposed within the space defined by the plurality of pixel electrode bars 321, and the drain electrode of the central TFT 35 is electrically connected to the central pixel electrode 32a by way of passing through the notch 322. Although the peripheral pixel electrode 32b is illustrated as having a block shape of in FIGS. 2 to 4, it does not constitute limitations to the invention. The peripheral pixel electrode 32b may take various shapes as desired.

As described above, the central pixel region controlled by the central pixel electrode 32a is the principal display region. Therefore, the area taken up by the peripheral pixel region is not much, and the width of the pixel electrode bars 321 of the peripheral pixel electrode 32b may be chosen as required. As an example, in the embodiment of the invention, the width of each of the pixel electrode bar 321 may be 1/10 to 1/5 of the width of the central pixel electrode 32a.

Another aspect of the invention further provides an electrochromic display which comprises the aforementioned array substrate provided by the embodiment of the invention. When the array substrate is driven, a first voltage $V_1$ and a second voltage $V_2$ may be respectively supplied to the central pixel electrode 32a and the peripheral pixel electrode 32b via the data line 33, and the first voltage $V_1$ and the second voltage $V_2$ are of opposite polarities.

It can be easily understood that the array substrate 30 is disposed in the electrochromic display panel and the electrochromic display panel comprises an electrochromic material.

Figure 5:
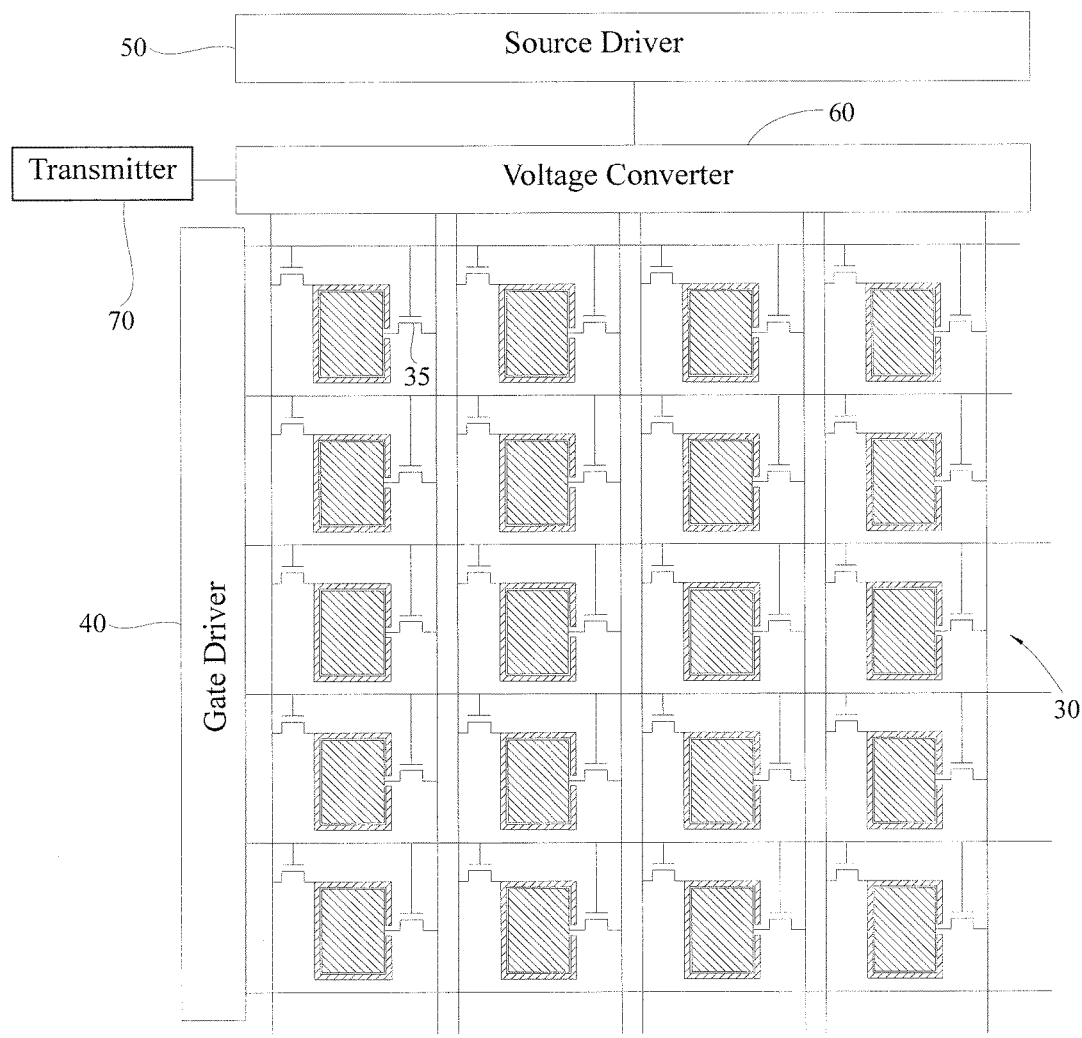
FIG. 5 schematically illustrates a driver circuit of the electrochromic display provided by the invention.

Furthermore, as illustrated in FIG. 5, the electrochromic display panel comprises a gate driver 40 and a source driver 50, the gate driver 40 is electrically connected to the plurality of scan lines 36, and the source driver 50 is electrically connected to the plurality of sets of data lines 33. The central pixel electrode 32a and the peripheral pixel electrode 32b are respectively electrically connected to the source driver 50 via the plurality of sets of data lines 33.

The gate driver 40 is connected to the scan lines 36 to generate a scan signal voltage. The source driver 50 is connected to the data lines 33 to generate polarity data signal voltages.

In an embodiment of the invention, the array substrate 30 comprises a peripheral TFT 34 and a central TFT 35, the gate driver 40 supplies the scan signal to the peripheral TFT 34 and the central TFT 35 via the scan lines 36 to control the ON and OFF states of the peripheral TFT 34 and a central TFT 35. In the embodiment of the invention, the peripheral TFT 34 and the central TFT 35 in the same pixel region are turned ON/OFF at the same time.

The source driver may supply a first voltage $V_1$ and a second voltage $V_2$ respectively to the central pixel electrode 32*a* and the peripheral pixel electrode 32*b* via the data line 33, the first voltage $V_1$ and the second voltage $V_2$ are of opposite polarities. When each set of data lines 33 respectively comprises a first data line 33*a* and a second data line 33*b*, the source driver 50 supplies the first voltage $V_1$ to the central pixel electrode 32*a* via the first data line 33*a* and supplies the second voltage $V_2$ to the peripheral pixel electrode 32*b* via the second data line 33*b*.

Figure 6:
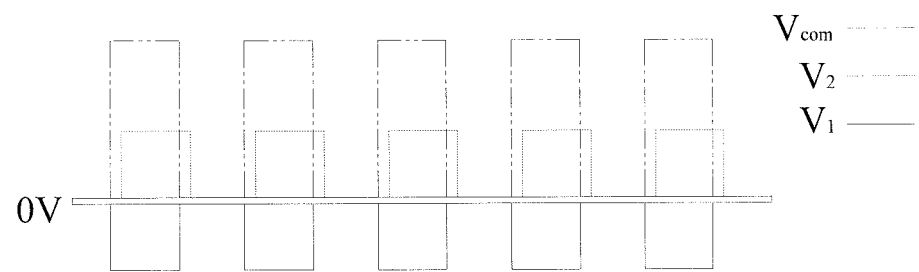
FIG. 6 is a timing diagram of a driving method provided by the invention.

FIG. 6 illustrates a schematic diagram of a driving mode of the electrochromic display provided by the embodiment of the invention, and $V_{com}$ is the voltage at the common electrode. As described above, a common electrode corresponding to a pixel electrode in each pixel region is disposed in the pixel region, and a common electrode line for supplying power to the common electrode is also disposed in the array substrate.

It is seen from FIG. 6 that the polarity of the central pixel electrode 32*a* is opposite to that of the peripheral pixel electrode when the electrochromic display is driven.

As discussed above, the central pixel electrode 32*a* supplies a voltage to the electrochromic material in the central pixel region, and the peripheral pixel electrode 32*b* supplies another voltage to the peripheral pixel region. Since the polarity of the central pixel electrode 32*a* is opposite to that of the peripheral pixel electrode 32*b*, the voltages applied by the central pixel electrode 32*a* and the peripheral pixel electrode 32*b* are opposite. In this case, the electrochromic material which flows from the central pixel region to the peripheral pixel region and has been changed in color will fade in color again under the action of the voltage applied by the peripheral pixel electrode 32*b*. It can thus effectively control the problem of incurring cross-talk between adjacent pixel regions in the electrochromic display panel and improve the display effect of the electrochromic display.

To conveniently control the polarities of the central pixel electrode 32*a* and the peripheral pixel electrode 32*b*, for example, the electrochromic display may further comprise a voltage converter 60, a first terminal of the voltage converter 60 is electrically connected to the source driver 50, a second terminal of the voltage converter 60 is electrically connected to the central pixel electrode 32*a*, and a third terminal of the voltage converter 60 is electrically connected to the peripheral pixel electrode 32*b*.

The electrochromic display may convert the data signal voltage provided by the source driver 50 to the first voltage $V_1$ and the second voltage $V_2$ which are at opposite polarities and transmit the converted voltages respectively to the central pixel electrode 32*a* and the peripheral pixel electrode 32*b*.

The first voltage $V_1$ and the second voltage $V_2$ may be synchronous or asynchronous according to different electrochromic materials. For some electrochromic materials having a fast response speed, the first voltage $V_1$ and the second voltage $V_2$ may be synchronous. As for electrochromic materials with a slow response speed, the first voltage $V_1$ and the second voltage $V_2$ may be asynchronous.

In the case where the first voltage $V_1$ and the second voltage $V_2$ are asynchronous to each other, the electrochromic display may further comprise a transmitter 70 for transmitting a control signal OE, and accordingly the voltage converter 60 further comprises a fourth terminal electrically connected to the transmitter 70.

Figure 7:
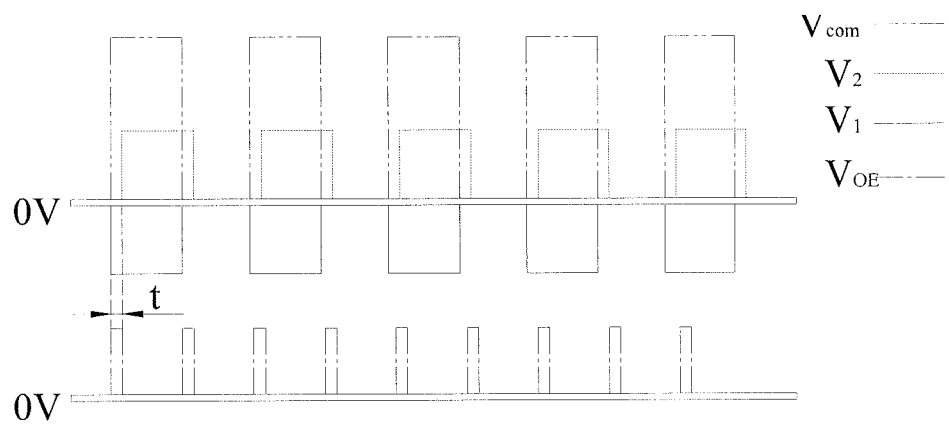
FIG. 7 is a time diagram of a preferred embodiment of the driving method provided by the invention.

In an example provided by the embodiment of the invention, the second voltage $V_2$ lags behind the first voltage $V_1$. In this case, the procedure of operation of the electrochromic display is as follows. As illustrated in FIG. 7, the transmitter 70 is configured to continuously emit a control signal OE at a predetermined interval; upon receiving the control signal OE, the voltage converter 60 only supplies the first voltage $V_1$ to the first data line 32*a*; in the case of not receiving the control signal OE, the voltage converter 60 supplies the first voltage $V_1$ to the first data line 32*a* and supplies the second voltage $V_2$ to the second data line 32*b*. The driving method will be described in detail in the following and will not be elaborated here.

As the amount of electrochromic material that has flown from the central pixel region to the peripheral pixel region and changed in color is relatively small, a small voltage applied in the peripheral pixel region may suffice to help the color to fade. As an example, an absolute value of the first voltage $V_1$ is no smaller than an absolute value of the second voltage $V_2$.

In an embodiment of the invention, the time lag of the second voltage $V_2$ may be determined according to the electrochromic material, and specific values of the first voltage $V_1$, the second voltage $V_2$ and the common electrode voltage $V_{com}$.

Still another aspect of the invention further provides a method for driving an array substrate. As illustrated in FIG. 2, the display region of an array substrate 30 comprises a plurality of sets of data lines 33 and a plurality of scan lines 36, the plurality of sets of data lines 33 and the plurality of scan lines 36 intersecting each other to divide the display region into a plurality of pixel regions, a pixel electrode 32 is disposed in each of the pixel regions and electrically connected to the data lines 33; the pixel electrode 32 comprises a central pixel electrode 32*a* and a peripheral pixel electrode 32*b* adjacent to and electrically isolated from the central pixel electrode. As illustrated in FIGS. 6 and 7, the driving method comprises supplying a first voltage $V_1$ to the central pixel electrode through the data line, and supplying a second voltage $V_2$ to the peripheral pixel electrode through the data line; the first voltage $V_1$ and the second voltage $V_2$ are art the opposite polarities.

As described above, the absolute value of the first voltage $V_1$ is no smaller than that of the second voltage $V_2$.

When the array substrate is applied to an electrochromic display, because a certain time is needed for the electrochromic material to response, in the embodiment of the invention, the central pixel region first changes its color under the action of the central pixel electrode 32*a* and then the electrochromic material flows to the peripheral pixel region. Therefore, the driving method may comprise supplying the first voltage $V_1$ first and then supplying the second voltage $V_2$.

In the electrochromic display provided by the embodiment of the invention, the above step may be realized by the transmitter together with the voltage converter.

As an example, the second voltage $V_2$ may lag behind the first voltage by 0.05 s to 0.1 s.

It can be understood by a person of ordinary skill in the art that the driving method further comprises supplying a scan signal to the central pixel electrode 32*a* and the peripheral pixel electrode 32*b* via the scan line 36. The scan signal is adapted to turn on the TFT corresponding to the pixel electrode 32.

As described above, in the array substrate 30 provided by the embodiment of the invention, a central TFT 35 and a peripheral TFT 34 are disposed in one pixel region, each set of the data lines 33 comprises a first data line 33a and a second data line 33b, the drain electrode of the central TFT 35 is electrically connected to the central pixel electrode 32a, the source electrode of the central TFT 35 is electrically connected to the first data line 33a, the drain electrode of the peripheral TFT 34 is electrically connected to the peripheral pixel electrode 32ab, and the source electrode of the peripheral TFT 35 is electrically connected to the second data line 33b. Therefore, the driving method provided by the embodiment of the invention may further comprise supplying the first voltage $V_1$ to the central pixel electrode 32a via the first data line 33a, supplying the second voltage $V_2$ to the peripheral pixel electrode 32b via the second data line 33b, and controlling ON and OFF states of the central TFT 35 and the peripheral TFT 34 via the scan line 36.

In the embodiment of the invention, the gate driver 40 provides the scan signal to the scan line 36. In an example of the invention, the array substrate 30 comprises a peripheral TFT 34 and a central TFT 35; the driving method provided by the embodiment of the invention further comprises supplying the scan signal to the peripheral TFT 34 and the central TFT 35 via the scan line 36 so as to control the ON and OFF states of the central TFT 35 and the peripheral TFT 34. In the embodiment of the invention, the peripheral TFT 34 and the central TFT 35 located in the same pixel region has the same state, that is, the peripheral TFT 34 and a central TFT 35 in the same pixel region turn ON/OFF at the same time.

Therefore, the driving method further comprises controlling the ON and OFF states of the central TFT 35 and the peripheral TFT 34 via same one scan line in each of the pixel region.

Although the array substrate and the method for driving the array substrate according to the embodiments of the invention are described by taking the electrochromic display as an example, a person of ordinary skill in the art will understand that the array substrate is not limited to the electrochromic display; instead, it may be applied to other kinds of display devices. As an example, the array substrate may be applied to an LCD and the like.

What are described above is related to the illustrative embodiments of the disclosure only and not limitative to the scope of the disclosure; the scopes of the disclosure are defined by the accompanying claims.

The invention claimed is:

1. An array substrate, a display region of the array substrate comprising a plurality of sets of data lines and a plurality of scan lines, the plurality of sets of data lines and the plurality of scan lines intersecting each other to divide the display region into a plurality of pixel regions, a pixel electrode being disposed in each of the pixel regions and electrically connected to one set of the data lines, wherein the pixel electrode comprises a central pixel electrode and a peripheral pixel electrode adjacent to and electrically isolated from the central pixel electrode and the set of the data lines are configured to supply a first voltage to the central pixel electrode and then supply a second voltage at an opposite polarity to a polarity of the first voltage to the peripheral pixel electrode before the first voltage is supplied to the central pixel electrode next time, and the second voltage lags behind the first voltage by 0.05 s to 0.1 s.

2. The array substrate of claim 1, wherein a central TFT and a peripheral TFT are disposed in the pixel region, each set of the data lines comprises a first data line and a second data line, a drain electrode of the central TFT is electrically connected to the central pixel electrode, a source electrode of the central TFT is electrically connected to the first data line, a drain electrode of the peripheral TFT is electrically connected to the peripheral pixel electrode, and a source electrode of the peripheral TFT is electrically connected to the second data line.

3. The array substrate of claim 2, wherein the central TFT and the peripheral TFT of each of the pixel regions are electrically connected to a same scan line.

4. The array substrate of claim 1, wherein the peripheral pixel electrode comprises a plurality of pixel electrode bars, a notch is formed in one of the plurality of pixel electrode bars, the central pixel electrode is disposed in a space defined by the plurality of pixel electrode bars, and the drain electrode of the central TFT is electrically connected to the central pixel electrode by way of the notch.

5. The array substrate of claim 4, wherein a width of each of the pixel electrode bars is $\frac{1}{10}$ to $\frac{1}{5}$ of a width of the central pixel electrode.

6. An electrochromic display comprising the array substrate of claim 1.

7. The electrochromic display of claim 6, wherein the electrochromic display comprises a gate driver and a source driver, the gate driver is electrically connected to the plurality of scan lines, and the source driver is electrically connected to the plurality of sets of data lines.

8. The electrochromic display of claim 7, further comprising a voltage converter, a first terminal of the voltage converter is electrically connected to the source driver, a second terminal of the voltage converter is electrically connected to the central pixel electrode, and a third terminal of the voltage converter is electrically connected to the peripheral pixel electrode.

9. The electrochromic display of claim 8, further comprising a transmitter configured for transmitting a control signal, the voltage converter further comprising a fourth terminal electrically connected to the transmitter.

10. The array substrate of claim 2, wherein the peripheral pixel electrode comprises a plurality of pixel electrode bars, a notch is formed in one of the plurality of pixel electrode bars, the central pixel electrode is disposed in a space defined by the plurality of pixel electrode bars, and the drain electrode of the central TFT is electrically connected to the central pixel electrode by way of the notch.

11. The array substrate of claim 3, wherein the peripheral pixel electrode comprises a plurality of pixel electrode bars, a notch is formed in one of the plurality of pixel electrode bars, the central pixel electrode is disposed in a space defined by the plurality of pixel electrode bars, and the drain electrode of the central TFT is electrically connected to the central pixel electrode by way of the notch.

12. A method for driving an array substrate, a display region of the array substrate comprising a plurality of sets of data lines and a plurality of scan ones, the plurality of sets of data lines and the plurality of scan lines intersecting each other to divide the display region into a plurality of pixel regions, a pixel electrode being disposed in each of the pixel regions and electrically connected to the data lines, the pixel electrode comprising a central pixel electrode and a peripheral pixel electrode adjacent to and electrically isolated from the central pixel electrode, the driving method comprising:
  supplying a first voltage to the central pixel electrode through one set of the data lines, and
  then supplying a second voltage to the peripheral pixel electrode through the set of the data lines before the first voltage is supplied to the central pixel electrode next time, the first voltage and the second voltage being at opposite polarities, and the second voltage lags behind the first voltage by 0.05 s to 0.1 s.

13. The driving method of claim 12, wherein an absolute value of the first voltage is no smaller than an absolute value of the second voltage.

14. The driving method of claim 13, wherein a central TFT and a peripheral TFT are disposed in the pixel region, each set of the data lines comprises a first data line and a second data line, a drain electrode of the central TFT is electrically connected to the central pixel electrode, a source electrode of the central TFT is electrically connected to the first data line, a drain electrode of the peripheral TFT is electrically connected to the peripheral pixel electrode, and a source electrode of the peripheral TFT is electrically connected to the second data line, the driving method comprising:
  supplying the first voltage to the central pixel electrode via the first data line,
  supplying the second voltage to the peripheral pixel electrode via the second data line, and
  controlling ON and OFF states of the central TFT and the peripheral TFT via the plurality of scan lines.

15. The driving method of claim 12, wherein the driving method comprises supplying the first voltage first and then supplying the second voltage.

16. The driving method of claim 15, wherein a central TFT and a peripheral TFT are disposed in the pixel region, each set of the data lines comprises a first data line and a second data line, a drain electrode of the central TFT is electrically connected to the central pixel electrode, a source electrode of the central TFT is electrically connected to the first data line, a drain electrode of the peripheral TFT is electrically connected to the peripheral pixel electrode, and a source electrode of the peripheral TFT is electrically connected to the second data line, the driving method comprising:
  supplying the first voltage to the central pixel electrode via the first data line,
  supplying the second voltage to the peripheral pixel electrode via the second data line, and
  controlling ON and OFF states of the central TFT and the peripheral TFT via the plurality of scan lines.

17. The driving method of claim 12, wherein a central TFT and a peripheral TFT are disposed in the pixel region, each set of the data lines comprises a first data line and a second data line, a drain electrode of the central TFT is electrically connected to the central pixel electrode, a source electrode of the central TFT is electrically connected to the first data line, a drain electrode of the peripheral TFT is electrically connected to the peripheral pixel electrode, and a source electrode of the peripheral TFT is electrically connected to the second data line, the driving method comprising:
  supplying the first voltage to the central pixel electrode via the first data line,
  supplying the second voltage to the peripheral pixel electrode via the second data line, and
  controlling ON and OFF states of the central TFT and the peripheral TFT via the plurality of scan lines.

18. The driving method of claim 17, comprising controlling the ON and OFF states of the central TFT and the peripheral TFT via a same scan line in each of the pixel regions.

19. The driving method of claim 12, wherein a central TFT and a peripheral TFT are disposed in the pixel region, each set of the data lines comprises a first data line and a second data line, a drain electrode of the central TFT is electrically connected to the central pixel electrode, a source electrode of the central TFT is electrically connected to the first data line, a drain electrode of the peripheral TFT is electrically connected to the peripheral pixel electrode, and a source electrode of the peripheral TFT is electrically connected to the second data line, the driving method comprising:
  supplying the first voltage to the central pixel electrode via the first data line,
  supplying the second voltage to the peripheral pixel electrode via the second data line, and
  controlling ON and OFF states of the central TFT and the peripheral TFT via the plurality of scan lines.

* * * * *